United States Patent [19]

Kim

[11] Patent Number: 5,597,666

[45] Date of Patent: Jan. 28, 1997

[54] METHOD FOR FABRICATION OF A MASK

[75] Inventor: Hong S. Kim, Seoul, Rep. of Korea

[73] Assignee: Gold Star Electron Co., Ltd., Rep. of Korea

[21] Appl. No.: 821,938

[22] Filed: Jan. 14, 1992

[30] Foreign Application Priority Data

Jan. 14, 1991 [KR] Rep. of Korea .................. 461/1991

[51] Int. Cl.⁶ ........................................ G03F 9/00
[52] U.S. Cl. .................. 430/5; 430/311; 430/323; 428/428
[58] Field of Search ................ 430/5, 311, 323; 428/428

[56] References Cited

U.S. PATENT DOCUMENTS

| | | | |
|---|---|---|---|
| 4,360,586 | 11/1982 | Flanders et al. | 430/321 |
| 4,459,325 | 7/1984 | Nozawa et al. | 430/313 |
| 4,873,163 | 10/1989 | Watakabe et al. | 430/5 |
| 4,890,309 | 12/1989 | Smith et al. | 378/35 |
| 5,045,417 | 9/1991 | Okamoto | 430/5 |

*Primary Examiner*—S. Rosasco
*Attorney, Agent, or Firm*—Faegre & Benson, LLP

[57] ABSTRACT

The present invention relates to a method for fabrication of a mask capable of stabilizing the size and the thickness thereof.

A method for fabrication of a mask according to the present invention comprises a step for successively depositing an oxide layer and a Cr layer on a quartz plate, a step for successively etching said oxide layer and said Cr layer by an E-beam, and a step for extending said oxide in volume by an oxidation process to form a phase-shifter.

Therefore, the size and thickness of a mask can easily be controlled by using an oxide instead of PMMA of the photosensitive film as a phase-shifter and endurability of a mask can be improved.

4 Claims, 2 Drawing Sheets

5,597,666

METHOD FOR FABRICATION OF A MASK

BACKGROUND OF THE INVENTION

The present invention relates to a method for fabrication of a phase-shifter mask which facilitates stabilizing the size and the thickness thereof.

In fabricating a semiconductor integrated device by using photo-lithography, a designated pattern is formed on the photosensitive film by radiating ultraviolet light onto the surface of a wafer through a mask.

To accomplish such an exposure process, use of contact methods, proximity methods and projection methods are all well-known. However, because the line width of the circuit is narrower as the semiconductor device have tended to become super integrated, the exposure processes have exhibited certain limitations in their use.

In another well-known exposure process, a wafer stepping method which is capable of obtaining the narrower line width, has also been used. However, because the contrast of the pattern which is copied into a photosensitive film is degraded in the wafer stepping method, it can not be used in fabricating semiconductor devices of high integration.

Accordingly, a method had now been suggested which involves using an inversion mask which shifts the phase of the light passing through the edge 180°, when the light is passed through the designated pattern formed on the mask. Thus, there is a phase difference of 180° at the edge of the designated pattern and the intensity of the light is 0 (zero), so that contrast at the edge portion is improved.

FIG. 1 shows a diagram illustrating a fabrication process for a phase-shift mask, according to the prior art, using poly methyl methacrylate (hereinafter, referred to as PMMA) as a phase-shifter.

The prior method for fabricating such a phase-shift mask is as follows.

First, as shown in FIG. 1(a), the Cr layer 30 as the mask plate and PMMA 20 of the photosensitive film as a phase-shifter are successively deposited on the quartz plate 10. Then, as shown in FIG. 1(b), PMMA 20 is exposed (or depicted) by the ultraviolet ray to form the designated pattern and, as shown in FIG. 1(c), the Cr layer is wet etched by using the said patterned PMMA as the mask for etching to form a Cr pattern.

According to the aforesaid method for fabrication of a mask, PMMA is patterned and then the Cr layer is wet etched, so that the thickness and size of the Cr pattern 30 of the mask plate become controlled and besides PMMA is used for a phase-shifter.

However, it is difficult to control the thickness of PMMA, which is regulated by viscosity of a solution and revolution speed in depositing. Therefore, as show in FIG. 1(c), the Cr pattern 30 has a trapezoid shape, so that contrast is degraded at the edge of the pattern.

Furthermore, it is very difficult to control the etching degree at the edge of the PMMA 20 and the endurability is not superior by using PMMA of the polymer system as a phase-shifter.

SUMMARY OF THE INVENTION

It is an object of the present invention to provide a method for fabrication of a mask, capable of stabilizing the size and the thickness thereof, and capable of improving endurability by using an oxidizable material instead of the prior art PMMA.

To obtain the above object, there is provided a method for fabrication of a mask comprising:

step 1: successively depositing a Cr layer and an oxidizable material layer on a quartz plate;

step 2: coating a photoresist on the oxidizable material and then forming a photoresist pattern by depicting the photoresist with an E-beam;

step 3: etching said oxidizable material layer and the Cr layer, in this order, by using the photoresist pattern as an etch mask;

step 4: extending said patterned oxidizable material in volume by an oxidation process to form a phase-shifter.

BRIEF DESCRIPTION OF THE DRAWINGS

The above and other objects and features of the present invention will be more apparent from the following detailed description of the preferred embodiment taken with the accompanying drawings, in which.

DETAILED DESCRIPTION OF THE PREFERRED EMBODIMENT

Hereinafter, the method for fabrication of a mask, and the operation and effect according to the present invention will be described in detail with reference to the accompanying FIG. 2.

The present invention uses an oxidizable material of either a polysilicon layer or an amorphous silicon layer as a phase-shifter instead of PMMA of the photosensitive film in order to fabricate a phase-shift mask.

FIG. 2 shows a diagram illustrating a fabrication process for a phase-shift mask, according to the present invention, using an oxidizable material as a phase-shifter.

Figure 1A:
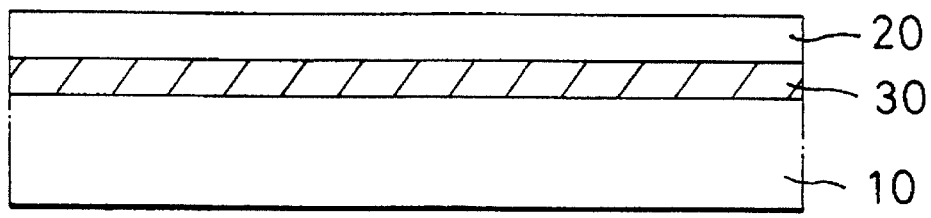
FIG. 1 is a diagram illustrating a fabrication process for a phase-shift mask by using PMMA as a phase-shifter, according to the prior art.
Figure 1B:
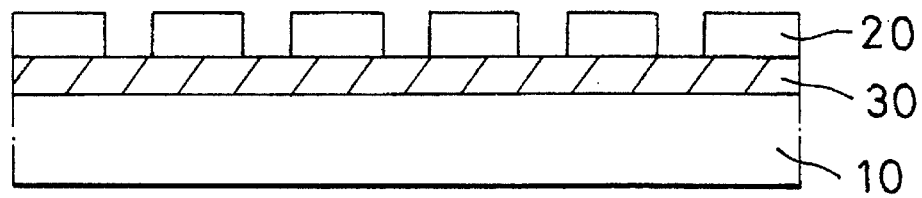
Figure 1C:
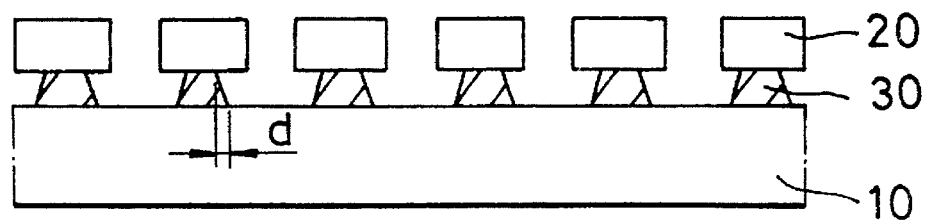
Figure 2A:
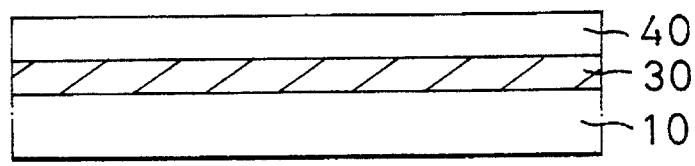
FIG. 2 is a diagram illustrating a fabrication process for a phase-shift mask according to the present invention, using an oxidizable material as a phase-shifter.

As shown in FIG. 2(a), the Cr layer 30 as the mask plate and the oxidizable material layer 40 as a phase-shifter are successively deposited on the quartz plate 10. At this time, an oxidizable material, such as polysilicon and an amorphous silicon, is used for a phase-shifter.

Figure 2B:
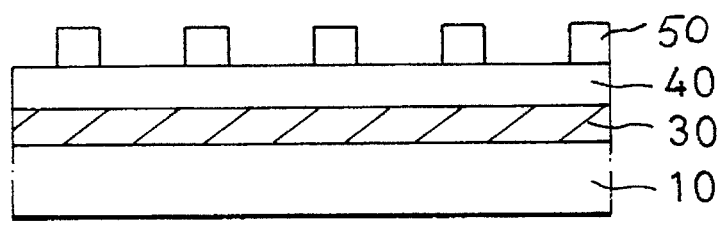
Figure 2C:
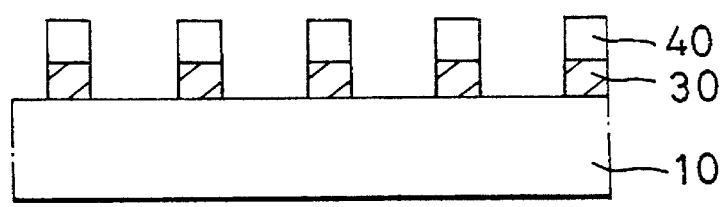

As shown in FIG. 2(b), a photoresist is coated and then depicted by an E-beam to form the pattern 50. The oxidizable material layer 40 is etched by using the photoresist pattern 50 as a mask for etching and said photoresist 50 is removed. As shown, in FIG. 2(c), the Cr layer 30 is etched by using the oxidizable material pattern 40 as a mask for etching to form a Cr pattern.

Figure 2D:
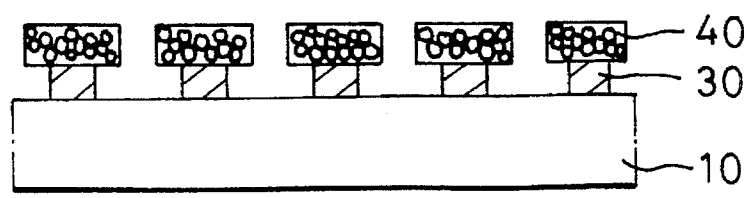

As shown in FIG. 2(d), the oxidizable material layer 40 is oxidized and is extended in volume by a known process. Therefore, a phase-shifter of stable size and thickness is formed.

The size and the thickness of the mask can easily be controlled by using the volume extension according to oxidation of an oxidizable material.

A metal film can also be used for the phase-shifter 40.

According to the method for fabrication of a phase-shifter mask of the present invention, a mask of stable thickness and size is obtained and endurability can be improved by using an oxidizable material as a phase-shifter.

Various modifications will become possible for those skilled in the art after receiving the teachings of the present invention disclosure without departing from the scope thereof.

What is claimed is:

1. A method for fabricating a mask, comprising:

providing a quartz plate;

depositing a Cr layer on the quartz plate;

depositing an oxidizable material layer over the Cr layer;

forming a photoresist pattern over the oxidizable material layer;

etching both the Cr layer and the oxidizable material layer, using the photoresist pattern as a mask; and extending the oxidizable material in volume by an oxidation process to form a phase-shifter.

2. A method for fabrication of a mask according to claim 1, wherein an oxidizable material of either polysilicon or amorphous silicon is used for a phase-shifter.

3. A method for fabrication of a mask according to claim 1, wherein a metal film is used for a phase-shifter.

4. A method for fabrication of a mask according to claim 1 wherein said oxide layer phase shifter shifts the phase of light passing through an edge thereof by 180° thereby improving the edge contrast of patterns defined by the mask.

* * * * *